(12) United States Patent
Elsayed

(10) Patent No.: US 10,659,045 B2
(45) Date of Patent: May 19, 2020

(54) APPARATUS WITH ELECTRONIC CIRCUITRY HAVING REDUCED LEAKAGE CURRENT AND ASSOCIATED METHODS

(71) Applicant: Silicon Laboratories Inc., Austin, TX (US)

(72) Inventor: Mohamed M. Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/634,716

(22) Filed: Jun. 27, 2017

(65) Prior Publication Data
US 2018/0375507 A1    Dec. 27, 2018

(51) Int. Cl.
| G01R 31/26 | (2014.01) |
| G11C 8/08 | (2006.01) |
| H01L 21/70 | (2006.01) |
| H03K 17/06 | (2006.01) |
| G11C 8/00 | (2006.01) |
| H03K 19/00 | (2006.01) |
| H03K 19/003 | (2006.01) |
| H03K 17/16 | (2006.01) |
| H03K 19/0185 | (2006.01) |

(52) U.S. Cl.
CPC ....... H03K 19/0013 (2013.01); H03K 17/162 (2013.01); H03K 19/003 (2013.01); H03K 19/0185 (2013.01); H03K 2217/0036 (2013.01)

(58) Field of Classification Search
CPC .... H03K 17/161; H03K 19/003; H03K 17/06; G05F 1/10; G05F 3/02; G11C 7/00; G11C 11/408; G11C 8/00

USPC ..... 327/108–112, 379, 389, 391; 326/22–27, 326/81–87
See application file for complete search history.

(56) References Cited

U.S. PATENT DOCUMENTS

| 6,025,737 A * | 2/2000 | Patel ................... H03K 19/0027 326/68 |
| 6,040,610 A * | 3/2000 | Noguchi ............. H01L 21/8238 257/314 |
| 6,078,207 A * | 6/2000 | Oguri .................. H03F 3/45183 327/319 |
| 6,144,075 A | 11/2000 | Chi |
| 6,512,705 B1 | 1/2003 | Koelling et al. |
| 7,245,548 B2 | 7/2007 | Derner et al. |
| 7,564,736 B2 | 7/2009 | Kobayashi |
| 7,635,882 B2 | 12/2009 | Chi |
| 7,646,653 B2 | 1/2010 | Choi |

(Continued)

OTHER PUBLICATIONS

U.S. Appl. No. 15/429,690, Dutta et al., filed Feb. 2017.

(Continued)

Primary Examiner — Brandon S Cole
(74) Attorney, Agent, or Firm — Law Offices of Maximilian R. Peterson

(57) ABSTRACT

An apparatus includes an integrated circuit (IC), which includes complementary metal oxide semiconductor (CMOS) circuitry. The CMOS circuitry includes a p-channel transistor network that includes at least one p-channel transistor having a gate-induced drain leakage (GIDL) current. The IC further includes a native metal oxide semiconductor (MOS) transistor coupled to supply a bias voltage to the at least one p-channel transistor to reduce the GIDL current of the at least one p-channel transistor.

20 Claims, 16 Drawing Sheets

(56) References Cited

U.S. PATENT DOCUMENTS

| | | | |
|---|---|---|---|
| 7,697,335 B2 | 4/2010 | Aritome | |
| 7,973,570 B2 | 7/2011 | Pigott et al. | |
| 8,189,391 B2 | 5/2012 | Itagaki et al. | |
| 8,391,078 B2 | 3/2013 | Leung | |
| 8,605,508 B2 | 12/2013 | Itagaki | |
| 8,685,812 B2 | 4/2014 | Chi | |
| 8,743,628 B2* | 6/2014 | Kim | G11C 11/4085 365/185.23 |
| 9,673,831 B1 | 6/2017 | Pandey | |
| 9,716,381 B2* | 7/2017 | Chen | H02H 9/046 |
| 2003/0102904 A1* | 6/2003 | Mizuno | G11C 5/147 327/544 |
| 2003/0141926 A1* | 7/2003 | Mizuno | H01L 23/5286 327/565 |
| 2008/0049539 A1* | 2/2008 | Miyata | G11C 8/08 365/230.06 |
| 2008/0142854 A1* | 6/2008 | Streif | G11C 11/4085 257/288 |
| 2010/0079195 A1* | 4/2010 | Sahin | H03K 17/08 327/427 |
| 2010/0123515 A1* | 5/2010 | Sasaki | G06F 1/3203 327/540 |
| 2010/0225382 A1* | 9/2010 | Ito | G01R 31/2621 327/535 |
| 2016/0216313 A1* | 7/2016 | Ogawa | G01R 31/2623 |
| 2017/0063306 A1* | 3/2017 | Abdelfattah | H03F 1/0205 |

OTHER PUBLICATIONS

Tomar et al., *Low Power Deign of Standard Digital Gate Design Using Novel Sleep Transistor Technique*, Int'l J. of Modern Eng'g Research Apr. 2014, 7 pp.

Fallah et al., *Standby and Active Leakage Current Control and Minimization in CMOS VLSI Circuits*, IEICE Transactions on Electronics 88-C(4):509-519 • Apr. 2005, 21 pp.

Parke et al., *Design for Suppression of Gate-Induced Drain Leakage in LDD MOSFET's Using a Quasi-Two-Dimensional Analytical Model*, IEE Transactions on Electron Devices, Jul. 1992, 10 pp.

Shah et al., *Comparative Study of Area, Delay and Power Dissipation for LECTOR and INDEP (Leakage ControlTechniques) At 70 nm Technology Node*, 2015 IEEE Int'l Advance Computing (IACC), Jun. 2015, 6 pp.

\* cited by examiner

APPARATUS WITH ELECTRONIC CIRCUITRY HAVING REDUCED LEAKAGE CURRENT AND ASSOCIATED METHODS

TECHNICAL FIELD

The disclosure relates generally to electronic circuitry with improved power consumption and, more particularly, to integrated circuit (IC) apparatus with reduced power consumption, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

The result has been a growing trend to produce circuitry and systems with increased numbers of transistors and similar devices. The increased number of devices has also coincided with increased power consumption of electronic circuits, such as ICs. Various mechanisms, such as device leakage, underlie the increased power consumption. Technologies such as metal oxide semiconductor (MOS) or complementary MOS (CMOS), which are used in a variety of IC devices, use devices such as transistors with leakage currents.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an IC, which includes CMOS circuitry. The CMOS circuitry includes a p-channel transistor network that includes at least one p-channel transistor having a gate-induced drain leakage (GIDL) current. The IC further includes a native MOS transistor coupled to supply a bias voltage to the at least one p-channel transistor to reduce the GIDL current of the at least one p-channel transistor.

According to another exemplary embodiment, an apparatus includes an IC, which includes CMOS circuitry. The CMOS circuitry includes an n-channel transistor network that includes at least one n-channel transistor having a GIDL current. The IC further includes a native MOS transistor coupled to supply a bias voltage to the at least one n-channel transistor to reduce the GIDL current of the at least one n-channel transistor.

According to another exemplary embodiment, a method of reducing a GIDL current of at least one transistor in a CMOS circuit includes using a native MOS transistor to supply a bias voltage to a gate of at least one transistor in the CMOS circuit so as to reduce a voltage between a drain and the gate of the at least one transistor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to improving the performance of electronic circuitry. More specifically, the disclosed concepts provide apparatus and methods for reducing the leakage and, thus, improving or reducing the power consumption of, electronic circuitry, such as ICs. Rather than modifying the semiconductor fabrication process, the techniques according to the disclosure use circuit-based approaches to reducing the leakage current of CMOS circuitry, as described below in detail.

In practical implementations, CMOS circuitry can have several leakage mechanisms. For example, the gates of p-channel transistors and the gates of n-channel transistors tend to leak current. In other words, the oxide layer used to construct the gates of the transistors is not a perfect insulator, which results in some leakage current. Generally, reverse-biased PN junctions will also leak a certain amount of current and therefore increase the overall leakage current of a CMOS circuit or IC.

CMOS circuits typically exhibit other leakage mechanisms. For instance, GIDL current may constitute a relatively large or substantial part of the total leakage current for CMOS circuits. GIDL may contribute a relatively large or substantial amount to the overall leakage of CMOS circuits employing lightly-doped drain (LDD) transistors designed for operation with relatively high supply voltages ($V_{DD}$), say, greater than 3 volts. Generally, the GIDL mechanism and the effects of LDD are known to, and understood by, persons of ordinary skill in the art.

Generally, GIDL currents increase the power consumption of CMOS circuits. In the normal mode (or high-power mode or active mode or powered) of operation, some transistors will undergo conditions that cause GIDL currents. The effects of GIDL currents are typically more pronounced in low-power mode (or sleep mode or hibernation mode or powered-down) modes of operation.

More specifically, the GIDL effect typically happens when an n-channel transistor is in the off condition, and its drain-gate voltage ($V_{dg}$) is relatively large. Conversely, in p-channel transistors, the GIDL effect typically happens when the transistor is in the off condition, and its gate-drain voltage ($V_{gd}$) is relatively large.

Note that a related phenomenon, gate-induced-source-leakage (GISL) current, exists if the source and drain of the transistor were switched around or swapped, either physically, or electrically (e.g., when the transistor is used as a sampler). Although the disclosure refers to GIDL currents, similar techniques may be used in exemplary embodiments to address and reduce GISL by making appropriate modifications to the techniques and exemplary embodiments described below, as persons of ordinary skill in the art will understand.

Figure 1:
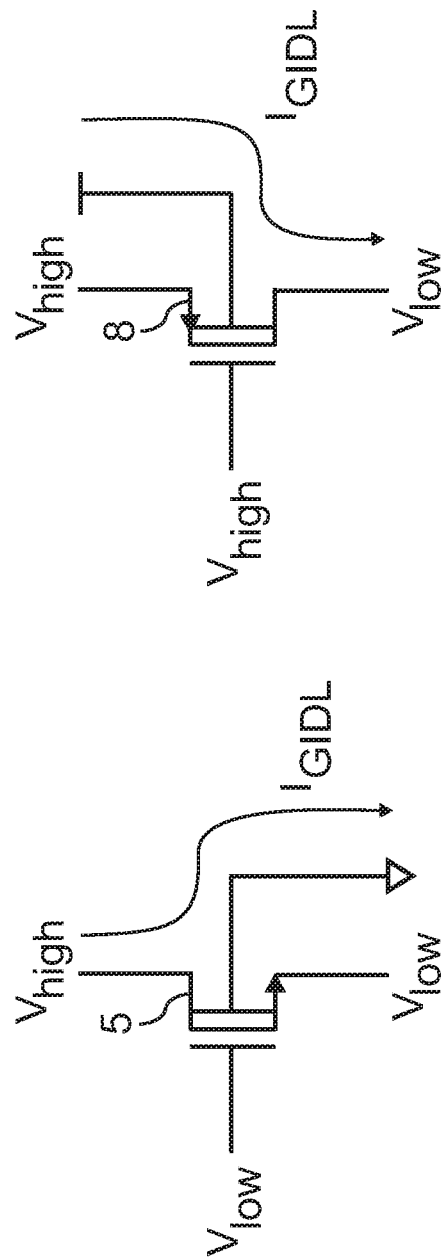
FIG. 1 illustrates a circuit arrangement for illustrating GIDL currents in n-channel and p-channel MOS transistors.

As FIG. 1 illustrates, the GIDL current, $I_{GIDL}$, flows from the drain of an n-channel MOS transistor (the left-side transistor in FIG. 1) to its bulk when the drain voltage is relatively high compared to the gate voltage, which is relatively low. Conversely, for a p-channel MOS transistor (the right-side transistor in FIG. 1), the GIDL current, $I_{GIDL}$, flows from the bulk of the transistor to its drain when the gate voltage is relatively high compared to its drain voltage, which is relatively low.

Figure 2:
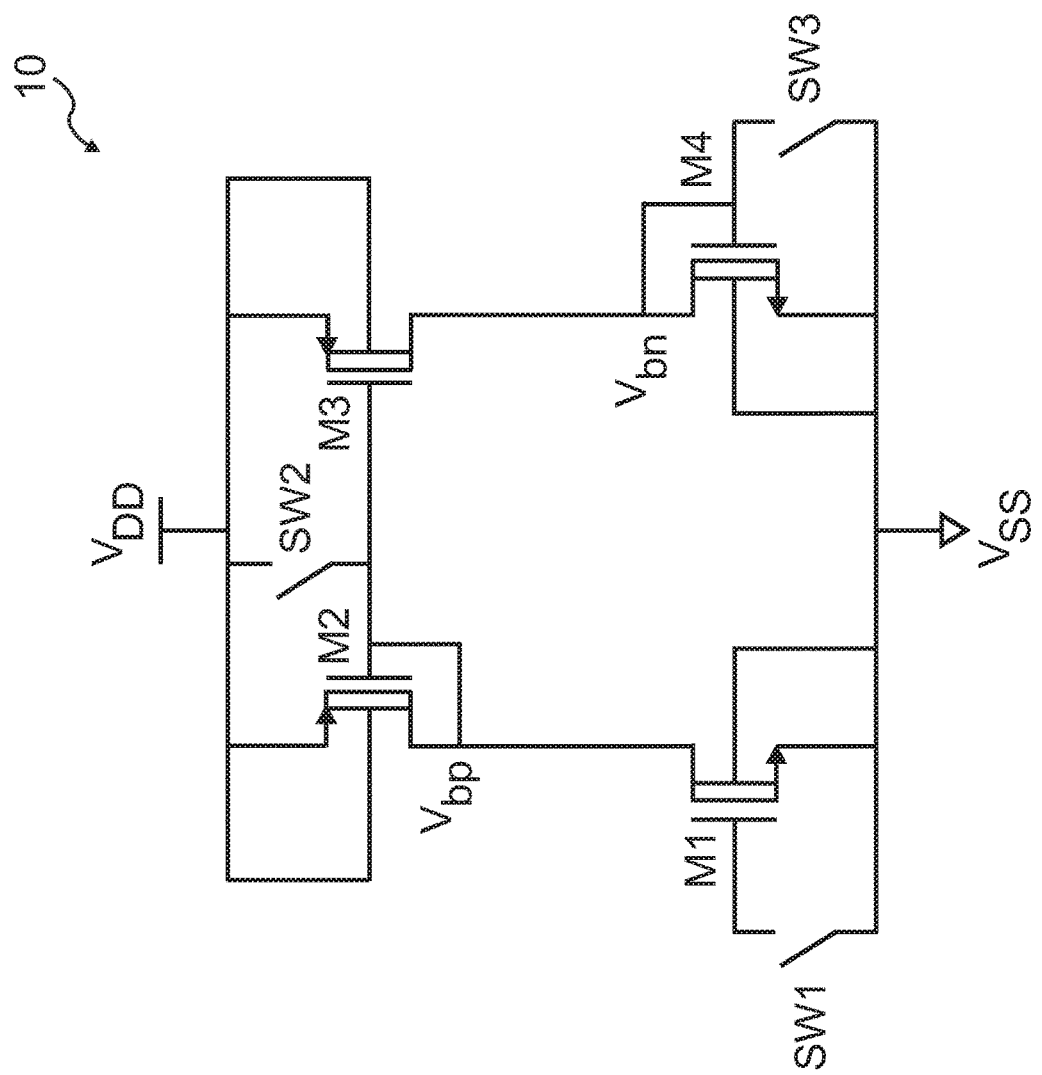
FIG. 2 depicts a circuit arrangement for illustrating GIDL currents in a CMOS circuit.

The transistor configuration that gives rise to GIDL currents is relatively common in analog circuits in the low-power mode in which the transistor is turned off, while its gate-drain (or drain-gate) voltage is relatively high, e.g., the supply voltage, $V_{DD}$. FIG. 2 depicts a circuit arrangement 10 for illustrating the GIDL current in a CMOS current source circuit.

In the low-power mode, switches SW1, SW2 and SW3 are all on, and $V_{bp}$ (shown on the figure) is the supply voltage while $V_{bn}$ (shown on the figure) is the ground potential. Transistors M1-M4 have gate-source voltages of zero. Consequently, transistors M1-M4 are off, and the current source circuit operates in the low-power mode.

Transistors M2 and M4 have drain-bulk voltages of zero (by virtue of switches SW2 and SW3 being closed). Consequently, transistors M2 and M4 do not contribute much, if any, to the total GIDL current of the circuit.

Note, however, that while transistor M1 is turned off, its drain-gate voltage is the supply voltage. Similarly, transistor M3 is turned off, and its gate-drain voltage is the supply voltage. Such a configuration induces GIDL currents, which affect the total power consumption of the circuit in low-power mode.

Figure 3:
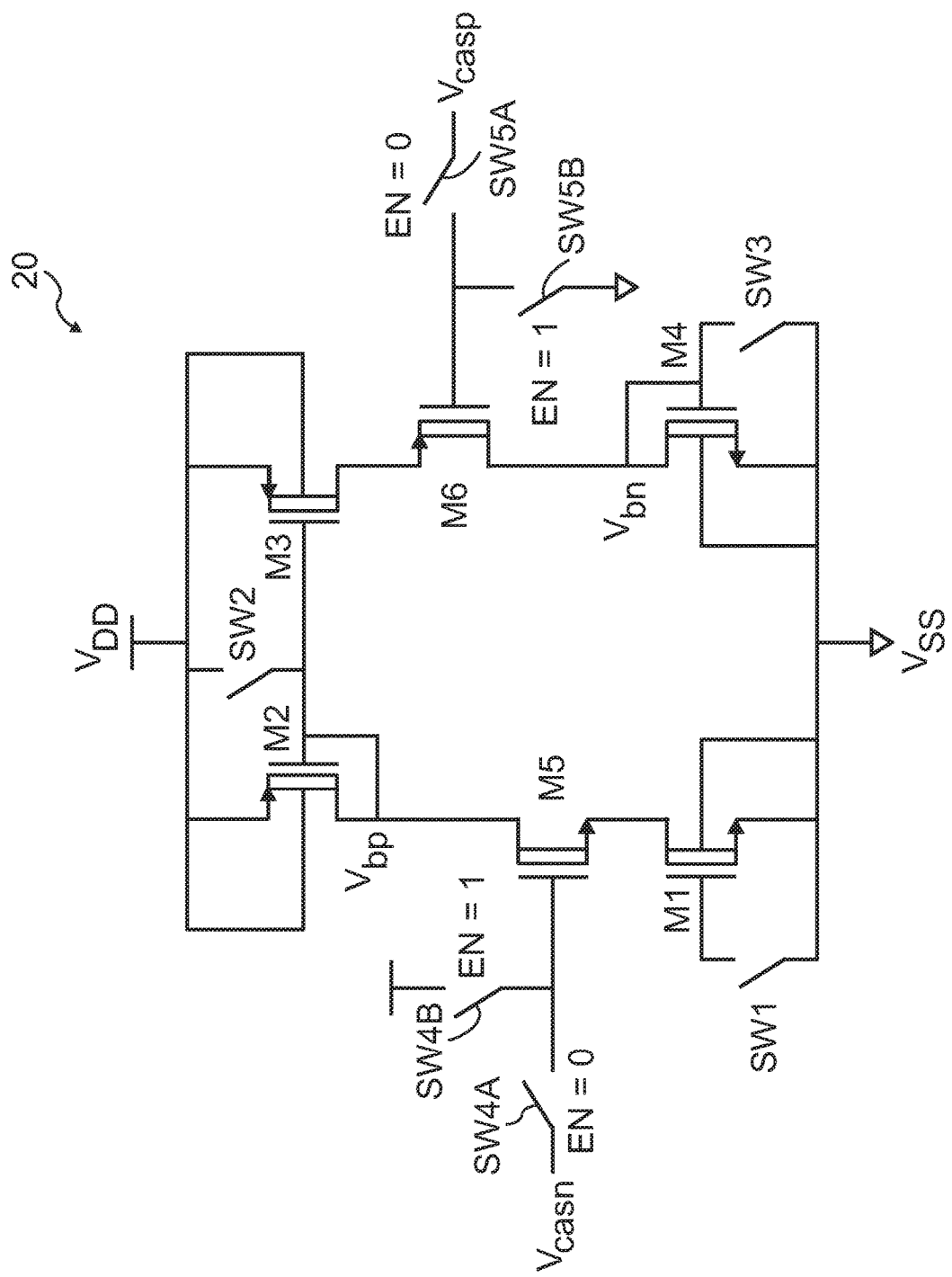
FIGS. 3-4 show circuit arrangements for reducing GIDL currents in CMOS circuits according to exemplary embodiments.

FIG. 3 shows circuit arrangement 20 for reducing GIDL in CMOS circuits according to an exemplary embodiment. More specifically, the circuit in FIG. 3 includes transistor M5 and transistor M6, coupled respectively between transistors M1-M2 and transistors M3-M4.

More specifically, the drain of n-channel transistor M5 is coupled to the drain of transistor M2, and the source of transistor M5 is coupled to the drain of transistor M1. The gate of transistor M5 is coupled through switch SW4A to a bias voltage $V_{casn}$. The gate of transistor M5 is further coupled through switch SW4B to the supply voltage, $V_{DD}$.

Similarly, the source of p-channel transistor M6 is coupled to the drain of transistor M3, and the drain of transistor M6 is coupled to the drain of transistor M4. The gate of transistor M6 is coupled through switch SW5A to a bias voltage $V_{casp}$. The gate of transistor M6 is further coupled through switch SW5B to the ground voltage, $V_{SS}$.

Thus, effectively, transistors M5 and M6 are coupled, respectively, in series with transistors M1 and M3 to reduce the voltages between the drains and gates of transistors M1 and M3. During the normal mode of operation, transistors M5 and M6 are turned on, i.e., the enable signal EN is asserted (EN=1), hence, switches SW4B and SW5B are closed. As a consequence, the gate of transistor M5 is coupled to the supply voltage, which turns it on. Similarly, the gate of transistor M6 is coupled to the ground potential, which turns on the transistor.

During the low-power mode of operation, however, the enable signal is de-asserted (EN=0). Thus, switches SW4A and SW5A are closed. As a result, the gate of transistor M5 is coupled to the bias voltage $V_{casn}$, and the gate of transistor M6 is coupled to the bias voltage $V_{casp}$. Bias voltage $V_{casn}$ is lower than $V_{DD}$, and bias voltage $V_{casp}$ is higher than $V_{SS}$. Consequently, the voltages across the drains and gates of transistors M1 and M3 are reduced and, as a result, the GIDL currents attributable to transistors M1 and M3 are reduced or eliminated (or nearly eliminated, given a practical, real-life implementation).

Figure 4:
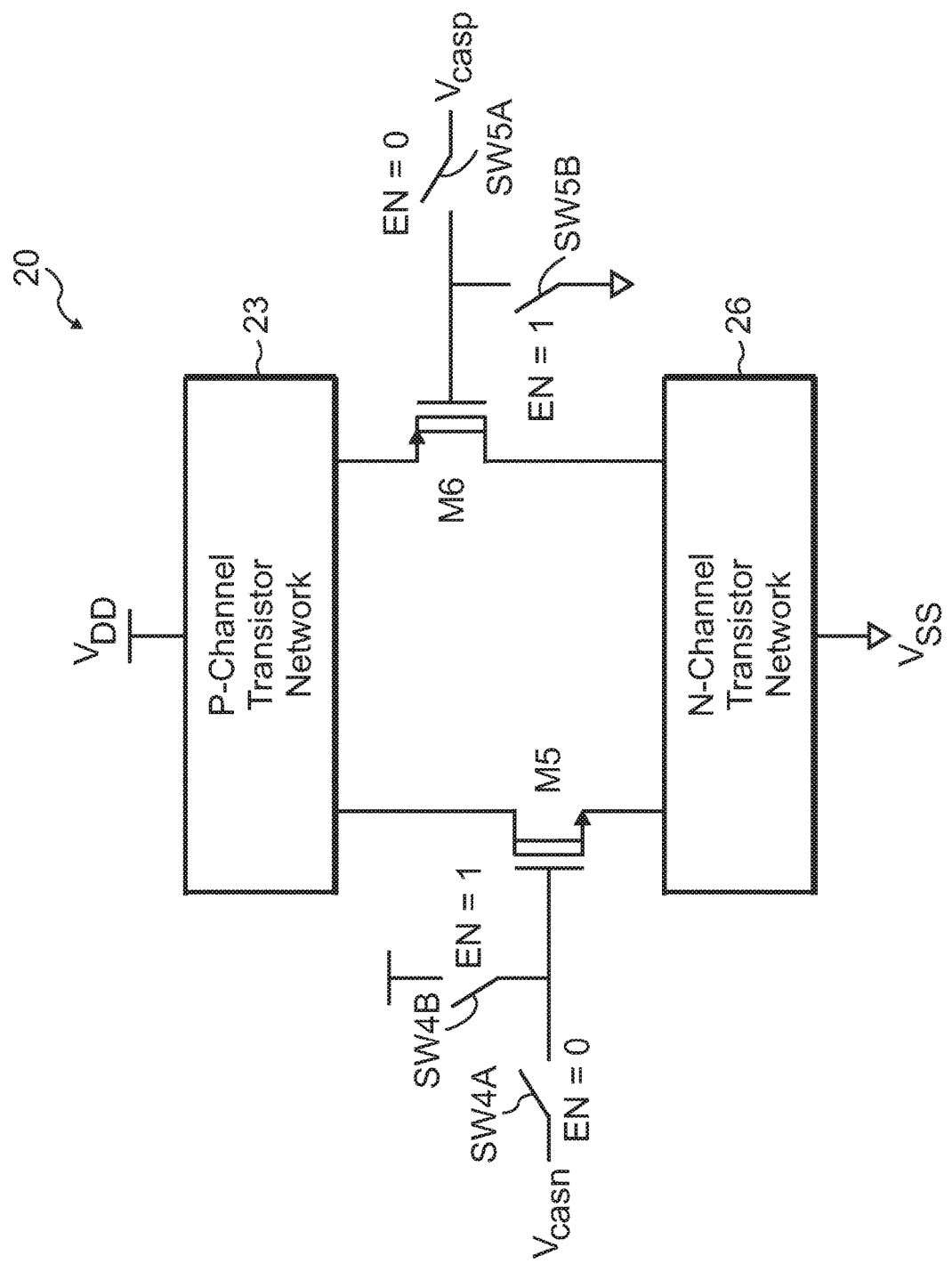

Although the GIDL-current reduction technique is described above in the context of a current-mirror circuit, the concepts may be generalized to other analog circuitry. FIG. 4 shows circuit arrangement 20 for reducing GIDL in a generalized analog CMOS circuit according to an exemplary embodiment.

More specifically, the CMOS circuit includes a p-channel transistor network 23, which is coupled to the supply voltage, $V_{DD}$. Network 23 includes one or more p-channel transistors to implement or realize a variety of functions. Examples include current sources, current mirrors, amplifiers, comparators, etc., as persons of ordinary skill in the art will understand.

Conversely, the CMOS circuit includes an n-channel transistor network 26, which is coupled to the ground voltage, $V_{SS}$. Network 26 includes one or more n-channel transistors to implement or realize a variety of functions, as described above. In some embodiments, network 26 is complementary to network 23, i.e., it uses n-channel transistors instead of p-channel transistors, but has a similar topology.

Transistor M5 is coupled between p-channel transistor network 23 and n-channel transistor network 26. The gate of transistor M5 is coupled to switches SW4A and SW4B, as described above.

Transistor M6 is also coupled p-channel transistor network 23 and n-channel transistor network 26. The gate of transistor M6 is coupled to switches SW5A and SW5B, as described above. Switches SW4A-SW4B and SW5A-SW5B are operated as described above to reduce the GIDL currents attributable to at least one transistor in p-channel transistor network 23 (a transistor that is coupled to transistor M5) and at least one transistor in n-channel transistor network 26 (a transistor that is coupled to transistor M6).

Note that in some embodiments, more than one transistor M5 and/or more than one transistor M6 may be used, as desired. In other words, depending on the specific topology of the CMOS circuit realized by p-channel transistor network 23 and n-channel transistor network 26, more than two circuit branches may exist between p-channel transistor network 23 and n-channel transistor network 26.

In such cases, more than one transistor M5 and/or more than one transistor M6 may be used to reduce the GIDL currents attributable to transistor(s) in p-channel transistor network 23 (one or more transistors that are coupled to transistor(s) M6) and transistor(s) in n-channel transistor network 26 (one or more transistors that are coupled to transistor(s) M5). The addition of transistor(s) M5 and transistor(s) M6 reduces the GIDL-current contribution of one or more transistors in n-channel transistor network 26 and one or more transistors in p-channel transistor network 23.

One aspect of the disclosure relates to the generation of bias voltage $V_{casn}$ and $V_{casp}$. In some embodiments for generating bias voltages, one or more native transistors are used, as described below in detail. Depending on the context and circuit in which a native transistor is used, the threshold voltage may be either the voltage that turns on the native transistor, or the voltage that causes the current flowing through the device to be zero (or nearly zero), as persons of ordinary skill in the art understand.

Thus, in some contexts, the threshold voltage of a native transistor refers to the voltage applied between the gate and the source that turns on the transistor. In other contexts, the threshold voltage of a native transistor refers to a voltage applied between the gate and source of the transistor that causes the current flowing through the device to equal zero (or nearly equal to zero in a practical implementation). Apparatus and methods according to the disclosure may be used in either context, as persons of ordinary skill in the art will understand.

Figure 5:
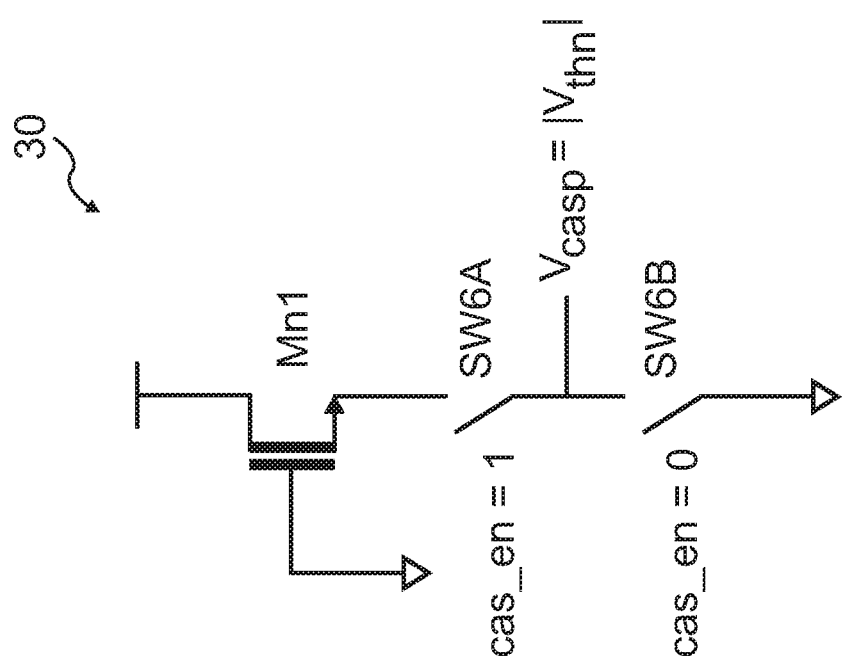
FIGS. 5-12 illustrate circuit arrangements for generating voltages used to reduce GIDL currents according to exemplary embodiments.

FIG. 5 shows a circuit arrangement 30 for generating bias voltage $V_{casp}$ used to reduce GIDL current according to an exemplary embodiment. In circuit arrangement 30, a native transistor, n-channel or NMOS transistor Mn1, is used to generate bias voltage $V_{casp}$. The source of transistor Mn1 is coupled to the ground voltage via switches SW6A and SW6B, while its drain is coupled to the supply.

More specifically, the source of transistor Mn1 is coupled to the output of the circuit (labeled "$V_{casp}$") through switch SW6A. The output of the circuit (labeled "$V_{casp}$") is coupled to ground via switch SW6B.

When the circuit is disabled, i.e., cas_en=0, switch SW6A is opened, and switch SW6B is closed. Conversely, switch SW6A is closed when the circuit is enabled, i.e., enable signal cas_en has a binary logic 1 value (cas_en=1).

The source voltage of transistor Mn1 equals $|V_{thn}|$, where $V_{thn}$ denotes the threshold voltage of transistor Mn1. Thus, when the circuit is enabled, the bias voltage $V_{casp}$ equals $|V_{thn}|$. Conversely, when the circuit is disabled (i.e., cas_en=0 and switch SW6B is closed), the bias voltage $V_{casp}$ is at the circuit-ground potential ($V_{casp}=V_{SS}$).

By driving PMOS transistor M6 in FIG. 3 or FIG. 4 using bias voltage $V_{casp}$, the voltage across transistor M3 in FIG. 3 (or across one or more transistors in p-channel transistor network 23 in FIG. 4) will be approximately $V_{DD}-V_{th6}-|V_{thn}|$ (where $V_{th6}$ denotes the threshold voltage of transistor M6) instead of $V_{DD}$, which reduces the GIDL current of the circuit.

Figure 6:
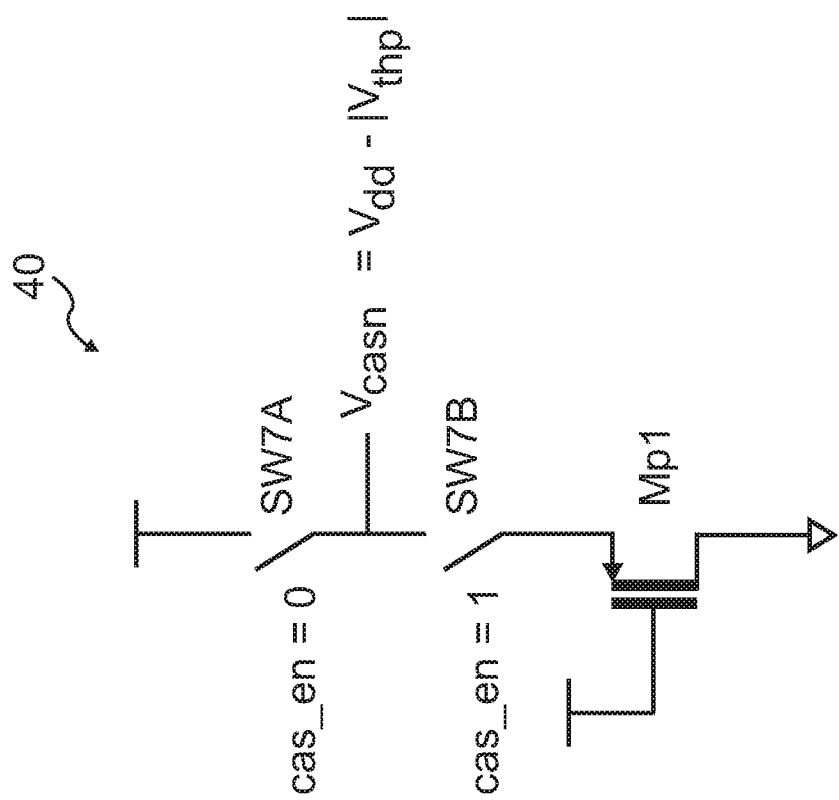

A similar arrangement may be used, employing native p-channel or PMOS transistors, to generate bias voltage $V_{casn}$, which is used to reduce the GIDL-current contribution of n-channel transistors. FIG. 6 shows a circuit arrangement 40 that uses this scheme.

In circuit arrangement 40, a native transistor, p-channel or PMOS transistor Mp1, is used to generate bias voltage $V_{casn}$. The drain of transistor Mp1 is coupled to the ground voltage, while its source is coupled to the supply voltage via switches SW7A and SW7B. More specifically, the source of transistor Mp1 is coupled to the output of the circuit (labeled "$V_{casn}$") through switch SW7B. The output of the circuit (labeled "$V_{casn}$") is coupled to the supply voltage via switch SW7A.

When the circuit is disabled, i.e., cas_en=0, switch SW7B is opened, and switch SW7A is closed. Conversely, switch SW7B is closed when the circuit is enabled, i.e., enable signal cas_en has a binary logic 1 value (cas_en=1).

The gate of transistor MP1 is coupled to the supply voltage. Consequently, the source voltage of transistor Mp1 will be $V_{DD}-|V_{thp}|$, where $V_{thp}$ denotes the threshold voltage of transistor Mp1. Thus, when the circuit is enabled, the bias voltage $V_{casn}$ equals $V_{DD}-|V_{thp}|$. Conversely, when the circuit is disabled (i.e., cas_en=0 and switch SW7A is closed), the bias voltage $V_{casn}$ is at the supply voltage ($V_{casn}=V_{DD}$).

By driving NMOS transistor M5 in FIG. 3 or FIG. 4 using bias voltage $V_{casn}$, the voltage across transistor M1 in FIG. 3 (or across one or more transistors in n-channel transistor network 26 in FIG. 4) will be $V_{DD}-V_{th5}-|V_{thp}|$ (where $V_{th5}$ denotes the threshold voltage of transistor M5) instead of $V_{DD}$, which reduces the GIDL current of transistor M1 and, hence, of the overall circuit.

Figure 7:
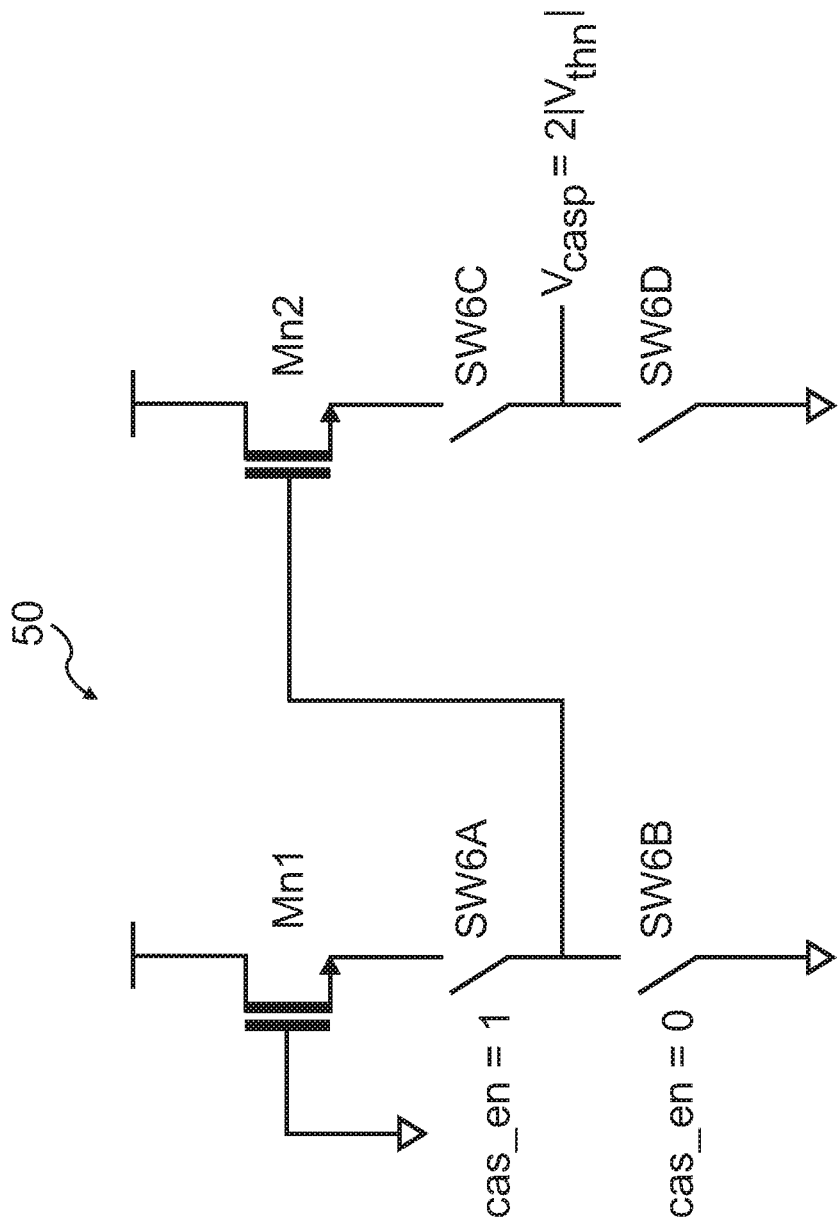

In some cases, larger bias voltages than the voltages provided by the circuits in FIGS. 5-6 may be desired. FIG. 7 shows a circuit arrangement 50 for generating bias voltage $V_{casp}$ according to an exemplary embodiment to provide a larger bias voltage.

In circuit arrangement 50, two stages of the circuit shown in FIG. 5 are used. The first stage, similar to the circuit in FIG. 5, includes native transistor Mn1, and switches SW6A and SW6B. The second stage similarly includes native transistor Mn2, and switches SW6C and SW6D. The gate of transistor Mn2, however, is driven by the output voltage of the first stage, i.e., by the common node between switches SW6A and SW6B.

In other words, while the gate of transistor Mn1 is coupled to the ground voltage, the gate of transistor Mn2 is driven to the output of the first stage, rather than the ground voltage. As a consequence, the bias voltage at the output of circuit arrangement 50 is $V_{casp}=2|V_{thn}|$, or twice as large as the output of circuit arrangement 30 in FIG. 5.

Figure 8:
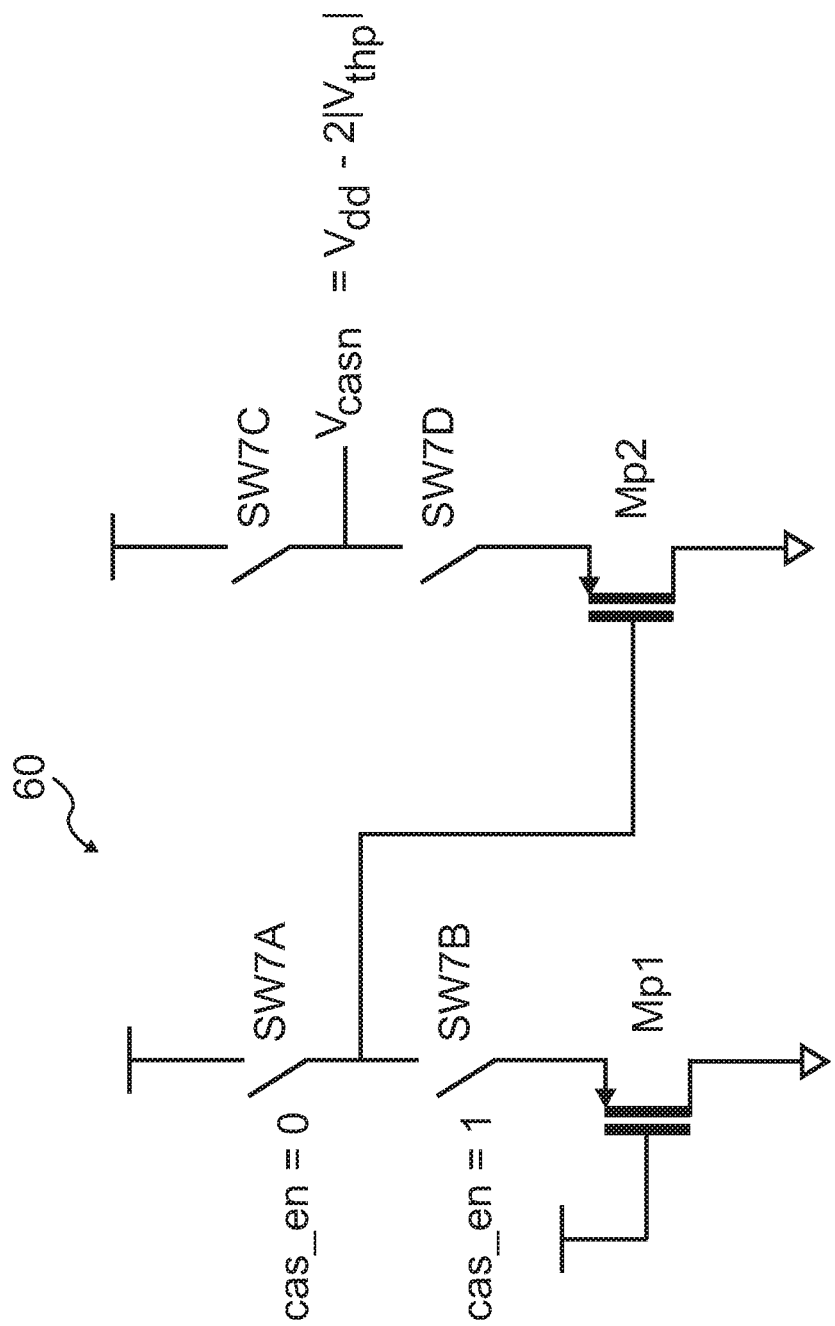

A similar technique may be used to generate bias voltage $V_{casn}$. FIG. 8 shows a circuit arrangement 60 according to another exemplary embodiment, whose output, $V_{casn}$, is $V_{DD}-2|V_{thp}|$.

In circuit arrangement 60, two stages of the circuit shown in FIG. 6 are used. The first stage, similar to the circuit in FIG. 6, includes native transistor Mp1, and switches SW7A and SW7B. The second stage similarly includes native transistor Mp2, and switches SW7C and SW7D. The gate of transistor Mp2, however, is driven by the output voltage of the first stage, i.e., by the common node between switches SW7A and SW7B.

Thus, although the gate of transistor Mp1 is coupled to the supply voltage, the gate of transistor Mp2 is driven to the output of the first stage, rather than the supply voltage. As a consequence, the bias voltage at the output of circuit arrangement 60 is $V_{casn}=V_{DD}-2|V_{thn}|$, or twice as large as the output of circuit arrangement 40 in FIG. 6.

The concept of employing more than one circuit stage using native transistors to generate bias voltages may be generalized. For instance, in some embodiments, based on the GIDL data for a given semiconductor fabrication technology and circuit/device characteristics, and the maximum expected supply voltage, the number of circuit stages using native transistors may be selected or optimized in order to minimize or reduce the circuit's overall GIDL current.

Figure 9:
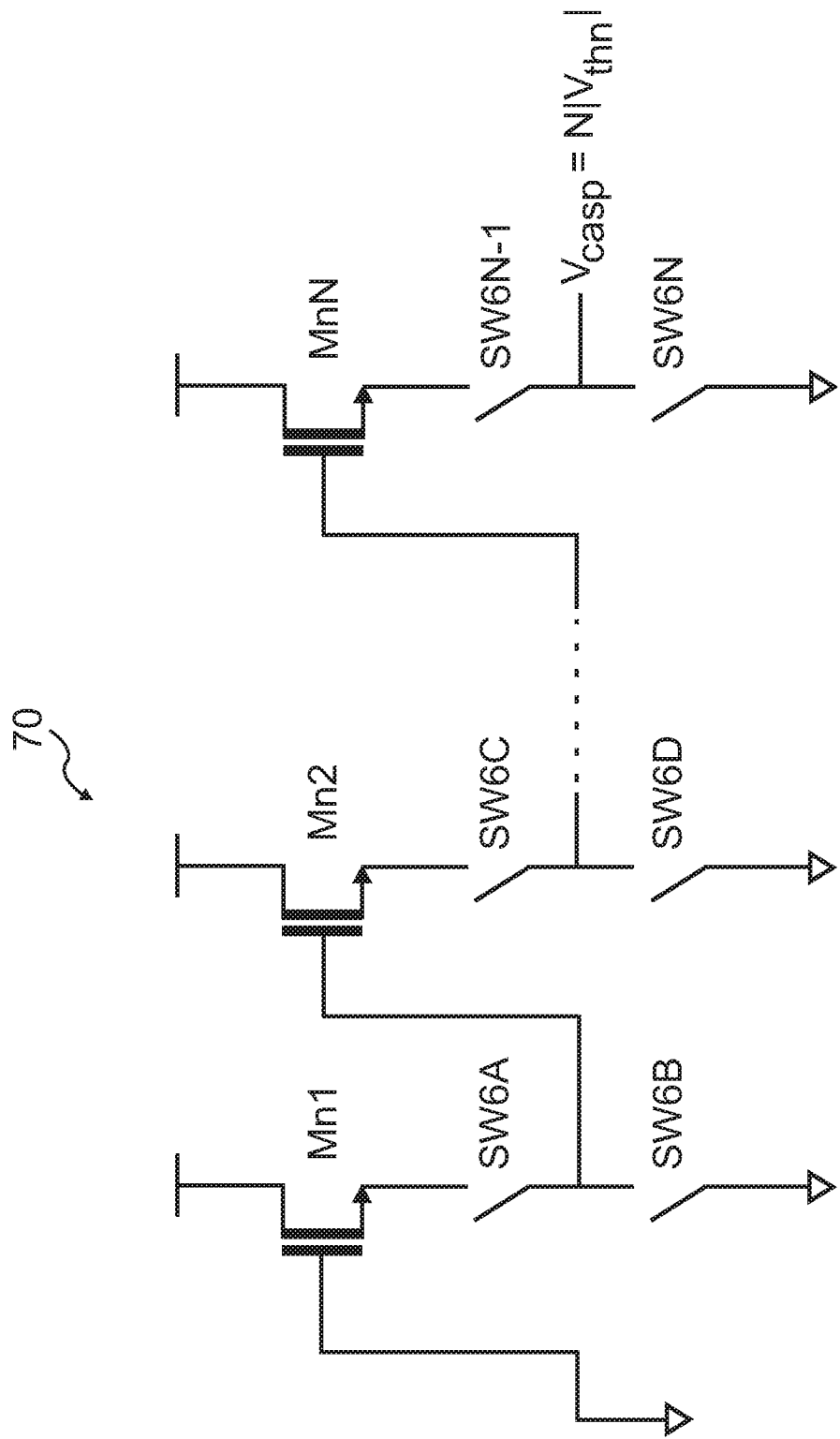

In general, N stages may be used, where N is selected as described above. FIG. 9 shows an N-stage circuit arrangement 70 for generating bias voltage $V_{casp}$ according to an exemplary embodiment. Circuit arrangement 70 uses N stages of the circuit shown in FIG. 5, where the output of each stage drives the gate of the native transistor in the succeeding stage.

In other words, circuit arrangement 70 includes N stages, each of which includes a native transistor and a pair of switches, similar to the circuit arrangement in FIG. 5. Thus, the first stage includes transistor Mn1 and switches SW6A and SW6B. The output of the first stage drives the gate of transistor Mn2 in the second stage, which includes switches SW6C and SW6D. The output of the second stage drives the gate of the transistor in the third stage, and so on.

The last stage includes transistor MnN and switches SW6N-1 and SW6N. The gate of native transistor MnN is driven by the output of the preceding stage (i.e., stage N-1), as described above. Consequently, the bias voltage at the output of circuit arrangement 70 is $V_{casp}=N|V_{thn}|$ (assuming transistors Mn1 through MnN have the same threshold voltage, $V_{thn}$).

In some embodiments, the bias voltage $V_{casp}$ may be selectable (or variable or programmable or configurable). More specifically, the bias voltage $V_{casp}$ may be selected from among the output voltages of one of the stages in circuit arrangement 70. For instance, in some embodiments, an analog multiplexer may be used to select the output voltage of one of the stages in circuit arrangement 70, and to supply that output voltage as the bias voltage $V_{casp}$.

Figure 10:
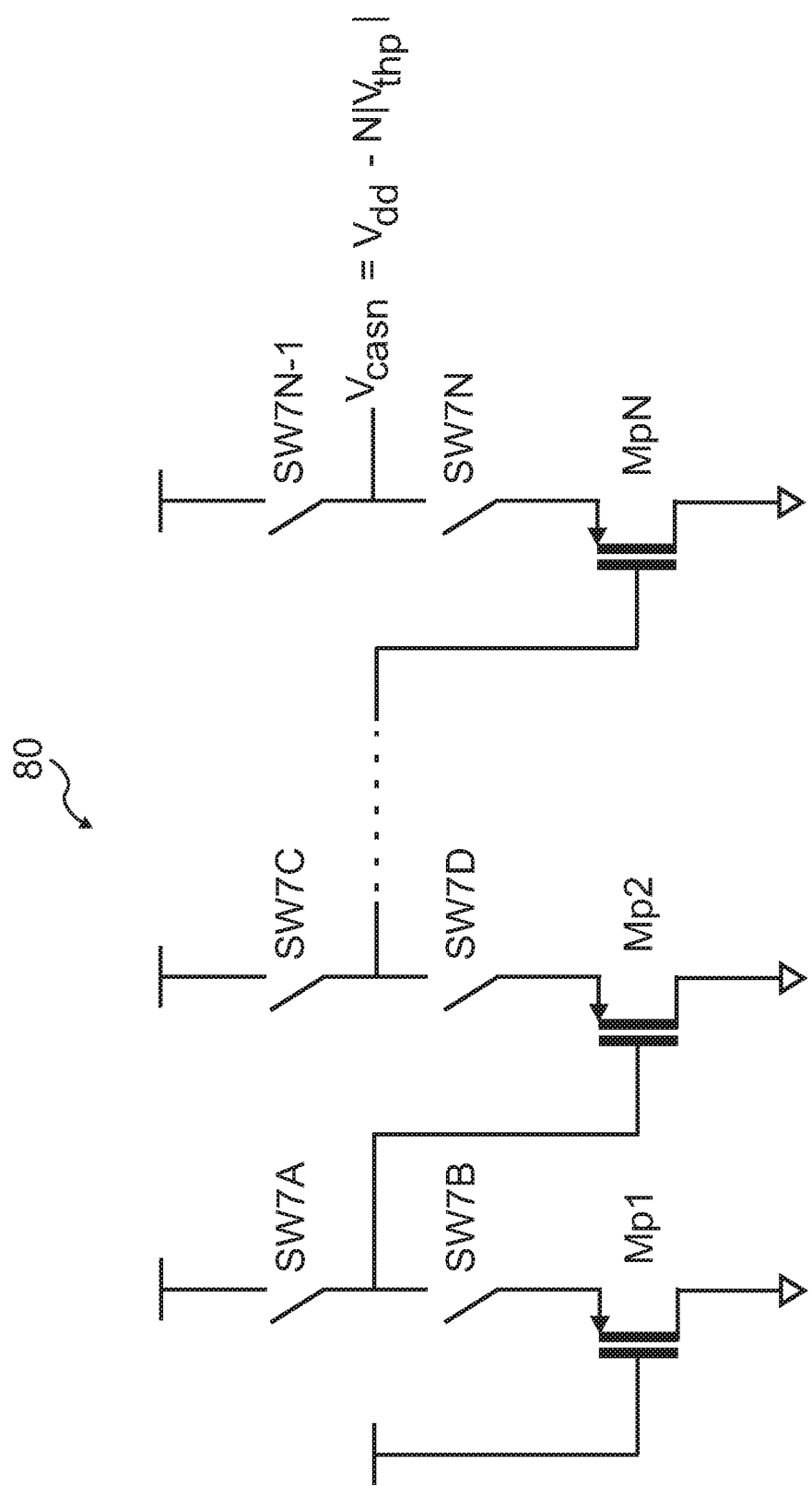

FIG. 10 shows an N-stage circuit arrangement 80 for generating bias voltage $V_{casn}$ according to an exemplary embodiment. Circuit arrangement 80 uses N stages of the circuit shown in FIG. 6, where the output of each stage drives the gate of the native transistor in the succeeding stage.

Thus, circuit arrangement 80 includes N stages, each of which includes a native transistor and a pair of switches, similar to the circuit arrangement in FIG. 6. The first stage includes transistor Mp1 and switches SW7A and SW7B. The output of the first stage drives the gate of transistor Mp2 in the second stage, which includes switches SW7C and SW7D. The output of the second stage drives the gate of the transistor in the third stage, and so on.

The last stage includes transistor MpN and switches SW7N-1 and SW7N. The gate of native transistor MpN is driven by the output of the preceding stage (i.e., stage N-1), as described above. Consequently, the bias voltage at the output of circuit arrangement 80 is $V_{casn}=V_{DD}-N|V_{thp}|$ (assuming transistors Mp1 through MpN have the same threshold voltage, $V_{thp}$).

In some embodiments, the bias voltage $V_{casn}$ may be selectable (or variable or programmable or configurable). More specifically, the bias voltage $V_{casn}$ may be selected from among the output voltages of the stages in circuit arrangement 80. For instance, in some embodiments, an analog multiplexer may be used to select the output voltage of one of the stages in circuit arrangement 80, and to supply that output voltage as the bias voltage $V_{casn}$.

One aspect of the disclosure relates to generating bias voltages $V_{casp}$ and $V_{casn}$ in situations where native devices are not available, e.g., not supported by the semiconductor fabrication process for a given implementation. In such scenarios, circuit arrangements that do not use native transistors may be used.

Figure 11:
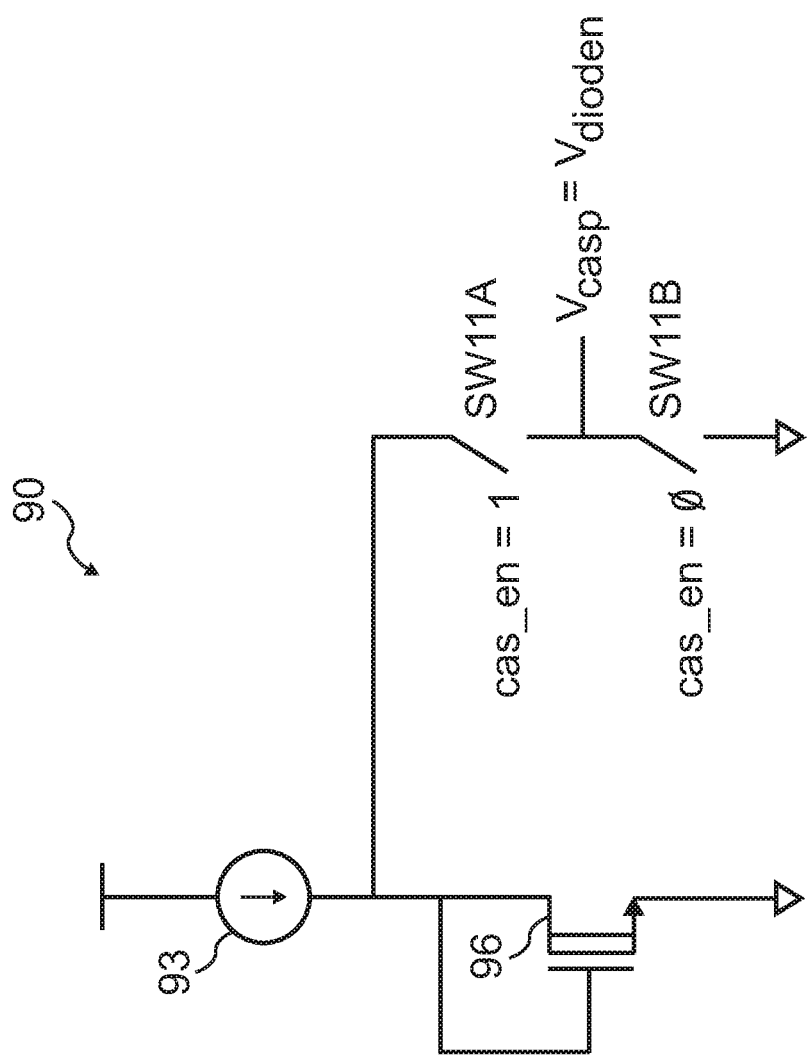

FIG. 11 shows a circuit arrangement 90 for generating bias voltage $V_{casp}$ according to an exemplary embodiment. In this embodiment, bias voltage $V_{casp}$ is generated by biasing diode-connected transistor 96 with a current supplied by current source 93. Because the gate and drain voltages of transistor 96 are the same, a voltage $V_{dioden}$ develops at the drain of transistor 96.

When the circuit is disabled, i.e., cas_en=0, switch SW11A is opened, and switch SW11B is closed. Conversely, switch SW11A is closed and switch SW11B is opened when the circuit is enabled, i.e., enable signal cas_en has a binary logic 1 value (cas_en=1).

When the circuit is enabled, the bias voltage $V_{casp}$ equals $V_{dioden}$. Conversely, when the circuit is disabled (i.e., cas_en=0 and switch SW11B is closed), the bias voltage $V_{casp}$ is at the circuit-ground potential ($V_{casp}=V_{SS}$).

The current supplied by current source 93 generally depends on factors such as device characteristics and the levels of current used in the overall circuit. In some embodiments, the current may be relatively small, for example, on the order of 1 nA.

Figure 12:
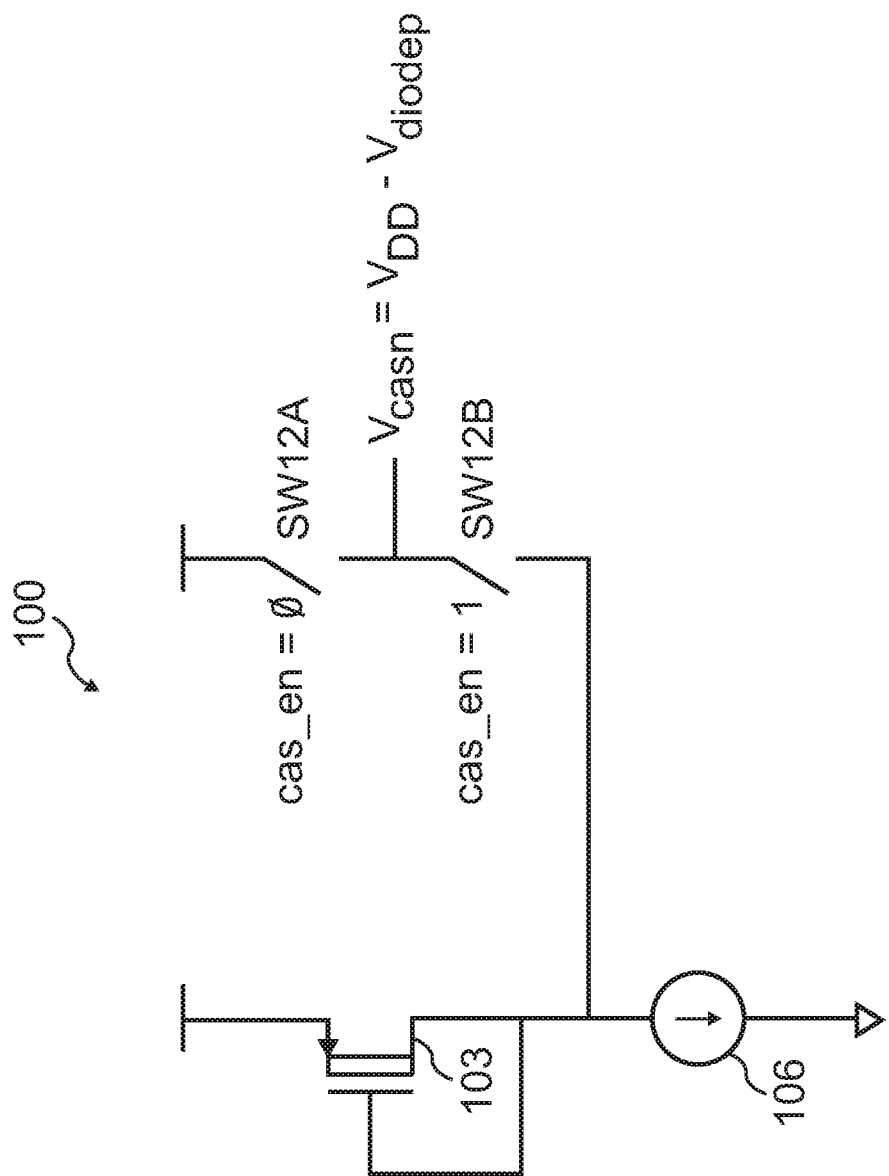

FIG. 12 shows a circuit arrangement 100 for generating bias voltage $V_{casn}$ according to an exemplary embodiment. In this embodiment, bias voltage $V_{casn}$ is generated by biasing diode-connected transistor 103 with a current sunk by current source 106. Because the gate and drain voltages of transistor 103 are the same, a voltage $V_{DD}-V_{diodep}$ develops at the drain of transistor 103.

When the circuit is disabled, i.e., cas_en=0, switch SW12B is opened, and switch SW12A is closed. Conversely, switch SW12B is closed and switch SW12A is opened when the circuit is enabled, i.e., enable signal cas_en has a binary logic 1 value (cas_en=1).

When the circuit is enabled, the bias voltage $V_{casn}$ equals $V_{DD}-V_{diodep}$. Conversely, when the circuit is disabled (i.e., cas_en=0 and switch SW12A is closed), the bias voltage $V_{casn}$ is at the supply voltage ($V_{casn}=V_{DD}$).

The current supplied by current source 106 generally depends on factors such as device characteristics and the levels of current used in the overall circuit. In some embodiments, the current may be relatively small, for example, on the order of 1 nA.

The circuit arrangements in FIGS. 11-12 may be cascaded to generate larger bias voltages. Thus, similar to the arrangements shown in FIG. 9, in some embodiments, several (generally N) of the circuit arrangement in FIG. 11 may be cascaded to generate a larger bias voltage $V_{casp}$. Similarly, similar to the arrangements shown in FIG. 10, in some embodiments, several (generally N) of the circuit arrangement in FIG. 12 may be cascaded to generate a smaller bias voltage $V_{casn}$.

Furthermore, in some embodiments, several diode-connected transistors may be used to generate larger bias voltages. For example, in some embodiments, rather than using a single diode-connected transistor 96 (as shown in FIG. 11), several (generally N) diode-connected transistors may be cascade-coupled, similar to series-coupled diodes. The entire cascade conducts the current supplied by current source 93. The bias voltage at the output of the circuit is $V_{casp}=N\ V_{dioden}$.

Similarly, in some embodiments, rather than using a single diode-connected transistor 103 (as shown in FIG. 12), several (generally N) diode-connected transistors may be cascade-coupled, similar to series-coupled diodes. The entire cascade is coupled to current source 106. The bias voltage at the output of the circuit is $V_{casn}=V_{DD}-N\ V_{diodep}$.

Furthermore, in some embodiments, one or both of the bias voltages ($V_{casn}$ and/or $V_{casp}$) may be selectable (or variable or programmable or configurable). More specifically, the bias voltage(s) may be selected from among the output voltages of the various stages in the circuits described above, or from a tap in a plurality of diode-connected transistors, described above. For instance, in some embodiments, an analog multiplexer may be used to select the output voltage of one of the stages in the circuits described above, or from a tap in a plurality of diode-connected transistors, described above. Such an arrangement may be used with either or both bias voltages ($V_{casn}$ and/or $V_{casp}$), as desired.

Note that compared to the embodiments using native transistors, the circuit arrangements in FIGS. 11-12 consume some power. In other words, the current sourced by current source 93 (see FIG. 11) and the current sunk by current source 106 flow through transistor 96 and transistor 103, respectively. As a result, the circuit arrangements in FIGS. 11-12 have a finite static power consumption that depends on the current sourced by current source 93 and sunk by current source 106.

Note that bias voltages $V_{casp}$ and $V_{casn}$ drive the gates of various transistors (e.g., transistors in p-channel transistor network 23 and transistors in n-channel transistor network 26 in FIG. 4). Given that gate leakage currents of MOSFETs is relatively small, the circuits described above for generating the bias voltages may drive a relatively large number (or even all) of MOSFETs in a circuit or IC in order to reduce GIDL currents.

Furthermore, note that any of the circuit arrangements for generating bias voltages may be used to bias either p-channel or n-channel transistors (e.g., transistors in p-channel transistor network 23 or transistors in n-channel transistor network 26 in FIG. 4). Thus, any of the circuit arrangements for generating bias voltages may be used to generate $V_{casp}$ or $V_{casn}$.

For example, an NMOS native device whose gate is coupled to ground and its drain coupled to the supply voltage will have a source voltage of $|V_{thn}|$. Cascading N replicas of such a circuit generates a bias voltage given by $N \cdot |V_{thn}|$. That bias voltage may be used to bias a NMOS transistor to reduce its GIDL-current contribution.

Furthermore, note that the magnitudes of the bias voltages may be somewhat inexact. In other words, reduced GIDL current by virtue of the application of the bias voltages is relatively insensitive to the exact value of the bias voltages. Consequently, semiconductor-fabrication process variations have relatively small impacts or effects on the GIDL-current reduction process.

Various modifications of the circuitry described in relation to exemplary embodiments are possible and contemplated. For example, in situations where variable or programmable output bias voltages (e.g., by using analog multipliers, as described above) are not used or desired, some or all of the switches shown in FIGS. 7-12 may be omitted.

More specifically, in some embodiments, switches in the circuit stages preceding the final circuit stage may be omitted. For example, in the circuit in FIG. 7, switches SW6A and SW6B may be omitted, and the source of transistor Mn1 would drive the gate of transistor Mn2. Switches SW6C and SW6D may be used with the cas_en signal to program the final output bias voltage, as described above. If programming the output bias voltage is not used or desired, switches SW6C and SW6D may be omitted, and the source of transistor Mn2 would provide the output bias voltage. Similar techniques and modifications may be used in FIGS. 8-12, as desired, and as persons of ordinary skill in the art will understand.

Figure 13:
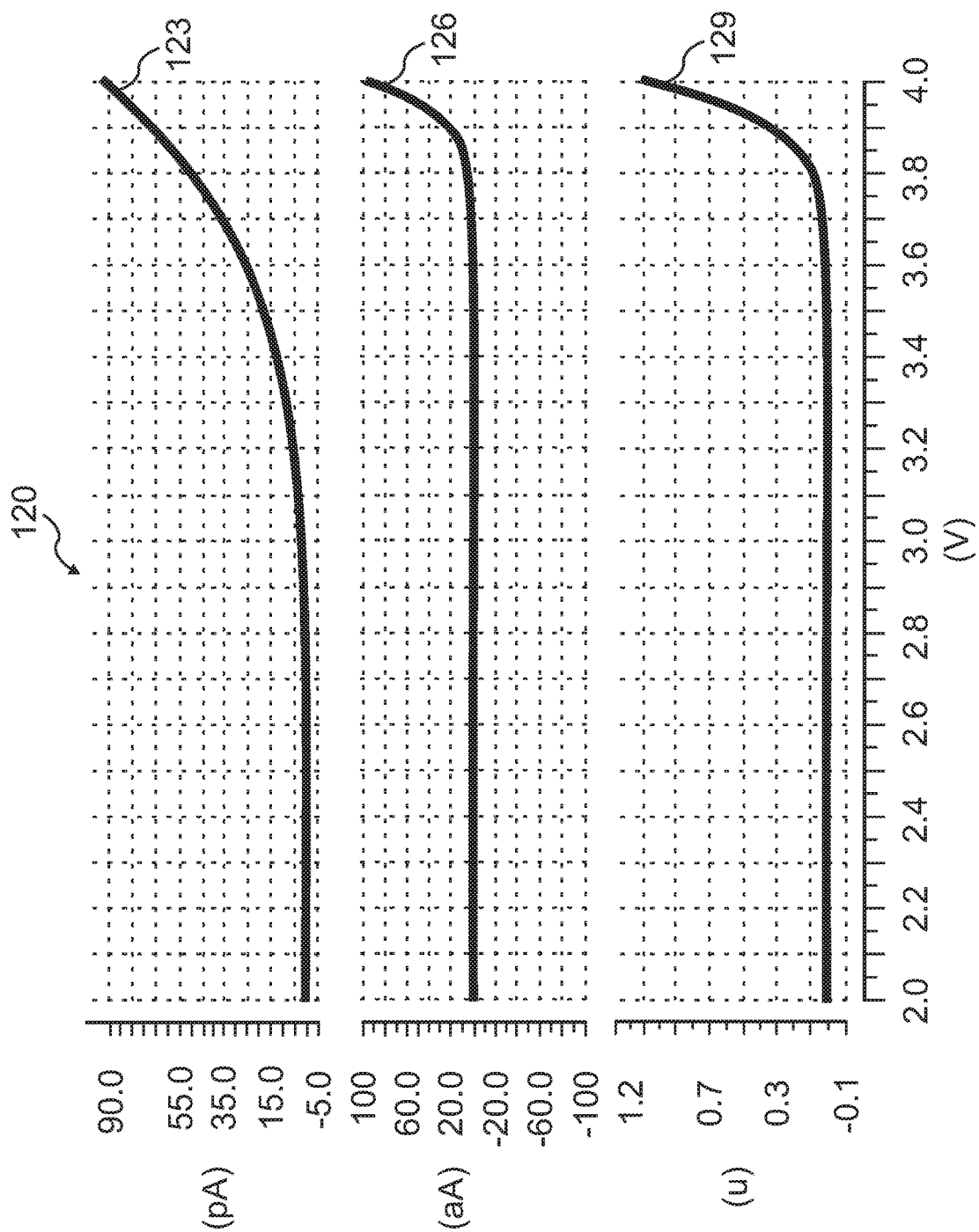
FIG. 13 depicts a plot of simulation results to illustrate GIDL-current reduction according to an exemplary embodiment.

FIG. 13 depicts a composite plot 120 of simulation results to illustrate GIDL-current reduction according to an exemplary embodiment. Specifically, plot 123 shows the GIDL current of transistors in circuit arrangement 10 in FIG. 2. Plot 126 shows the GIDL current of transistors in circuit arrangement 20 in FIG. 3. Plot 129 shows the ratio of the GIDL currents in plots 126 and 129. Note that, at a supply voltage of about 4 volts, the ratio is 1.096 u, or a GIDL-current reduction by a factor of about 912,409.

Various embodiments, such as the embodiments described above, relate to reducing the power consumption of CMOS circuits in the low-power mode of operation. One aspect of the disclosure relates to improve the operation of relatively low-power or ultra-low-power circuits in which the bias currents are in the range of, say, 1 nA or a few nA.

Figure 14:
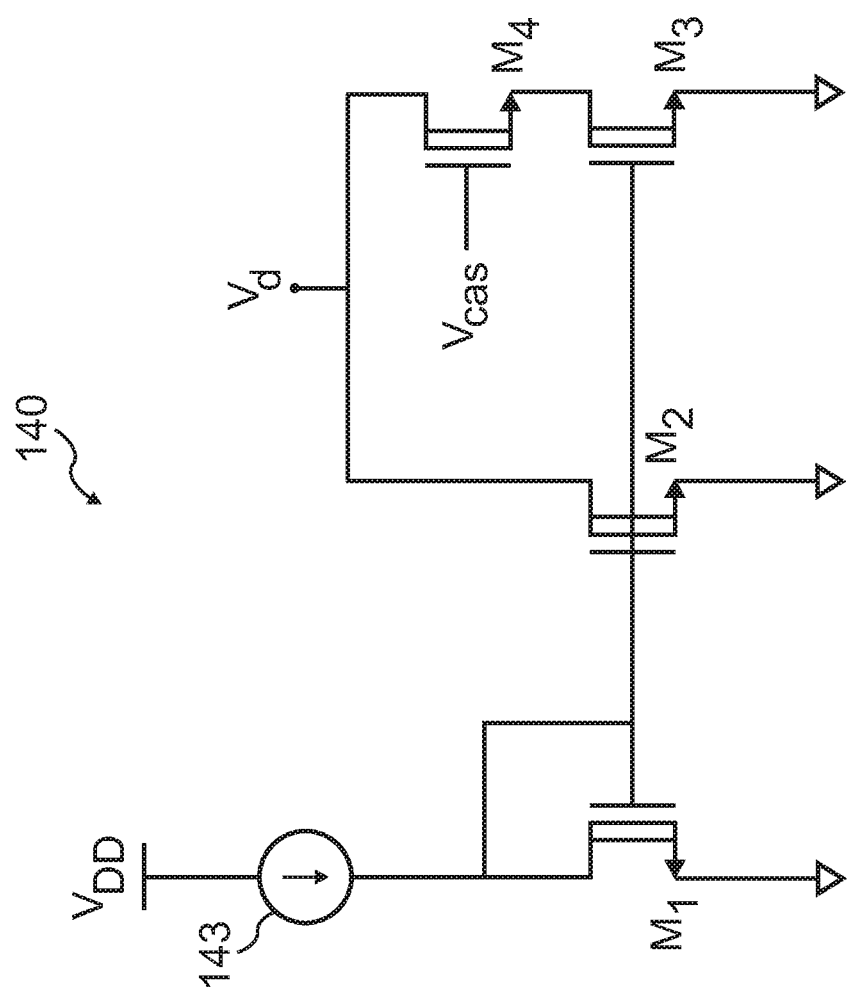
FIG. 14 illustrates a circuit arrangement for improving the operation of a CMOS circuit according to an exemplary embodiment.

FIG. 14 illustrates a circuit arrangement 140 for improving the operation of a CMOS circuit according to an exemplary embodiment. Transistor $M_1$ and constant current source 143 form a current source. Transistor $M_2$ is a current mirror, and mirrors the current conducted by transistor $M_1$.

Transistor $M_3$ is similarly a current mirror that mirrors the current conducted by transistor $M_1$. Note that both current mirrors are supplied by the same supply voltage, labeled Vd.

Unlike transistor $M_2$, however, transistor $M_3$ is coupled in series with transistor $M_4$. The gate of transistor $M_4$ is biased by bias voltage $V_{cas}$. Thus, transistor $M_4$ constitutes a GIDL-current-reduction transistor that reduces the GIDL current of transistor $M_4$.

In order to quantify the effect of GIDL-current-reduction transistor $M_4$, the drain voltage was swept in a simulation from 3 volts to 4 volts while, the GIDL currents of transistors $M_2$ and $M_4$ were monitored (the GIDL current of transistor $M_3$ is close to zero). In the simulation, $V_{cas}$ was set to 1.5 volts.

Figure 15:
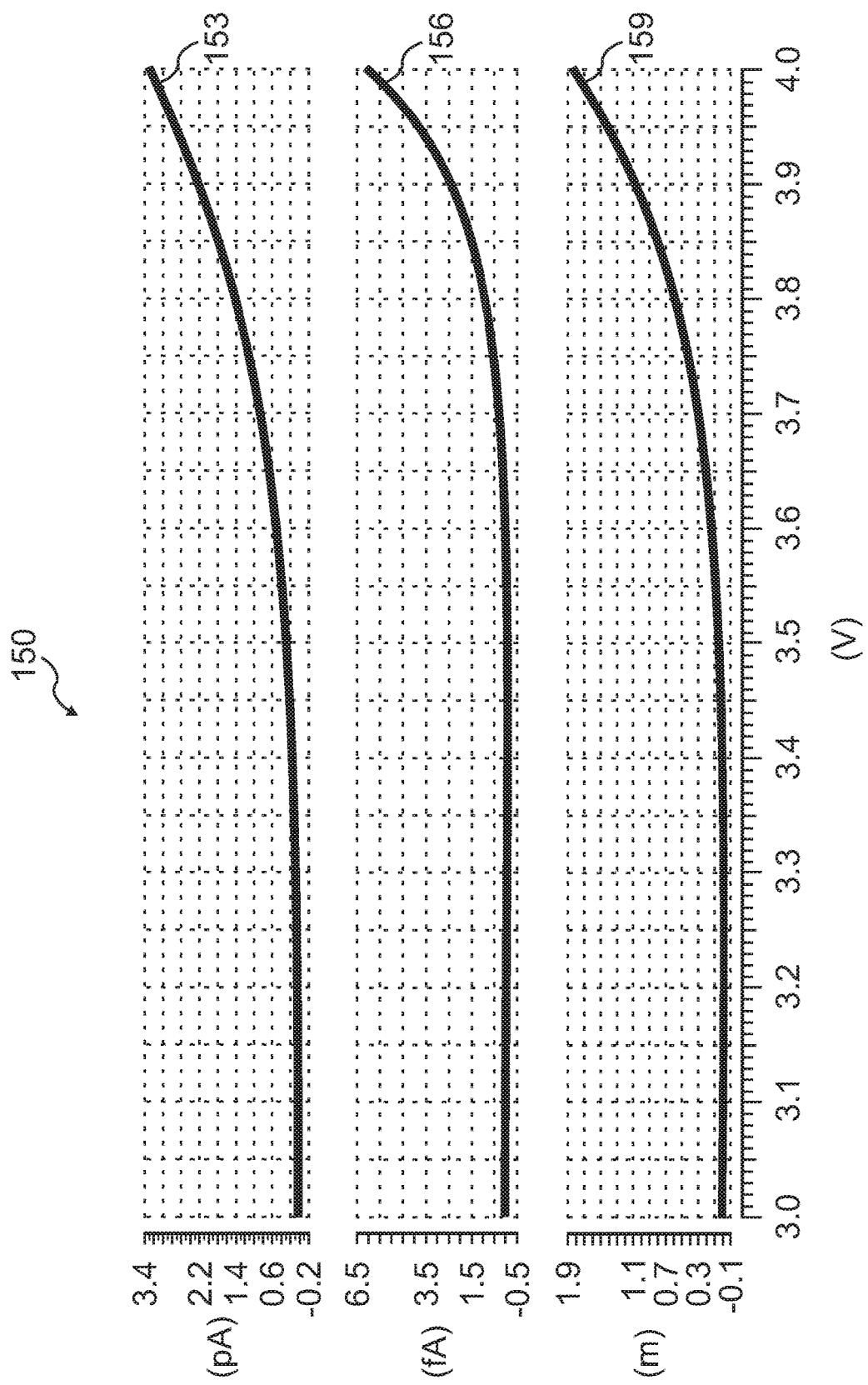
FIG. 15 depicts a plot of simulation results to illustrate GIDL-current reduction according to an exemplary embodiment.

FIG. 15 depicts a composite plot 150 of the simulation results. Plot 153 shows the GIDL current of transistor $M_2$. Plot 156 shows the GIDL current of transistor $M_4$. Plot 159 shows the ratio of the GIDL currents of transistor $M_4$ to the GIDL current of transistor $M_2$. The maximum ratio (1.8 m) in plot 159 implies that the GIDL current in transistor $M_4$ is reduced by a factor of about 555.

In exemplary embodiments, switches (e.g., switches SW4A-B, SW5A-B, etc.) are used to control the operation of the GIDL-current reduction circuitry. The switches may be implemented using a variety of techniques or circuitry, as desired. In some embodiments, the switches may be implemented as MOS field-effect transistors (MOSFETs), for example, p-channel transistors and/or n-channel transistors.

The choice of circuitry for a given implementation of the switches depends on a variety of factors, as persons of ordinary skill in the art will understand. Such factors include design specifications, performance specifications, cost, IC or device area, available technology, such as semiconductor fabrication technology), target markets, target end-users, etc.

Although the embodiments described above relate to GIDL-current reduction techniques for analog circuits, the same or similar techniques may be used in digital circuits. During normal operations of the analog/digital circuits, the transistors in the CMOS circuit are biased to be fully on, such that the circuit is not slowed down or affected adversely (e.g., the supply voltage and the ground voltage are used as bias voltages).

Once the circuit is turned off, however, the supply and ground bias voltages can be replaced by the bias voltages generated by exemplary embodiments, such as shown in FIGS. 5-12. This technique can thus maintain the speed of the digital (or mixed-signal) circuit during normal mode of operation, and yet reduce the leakage current in the low-power mode of operation.

Figure 16:
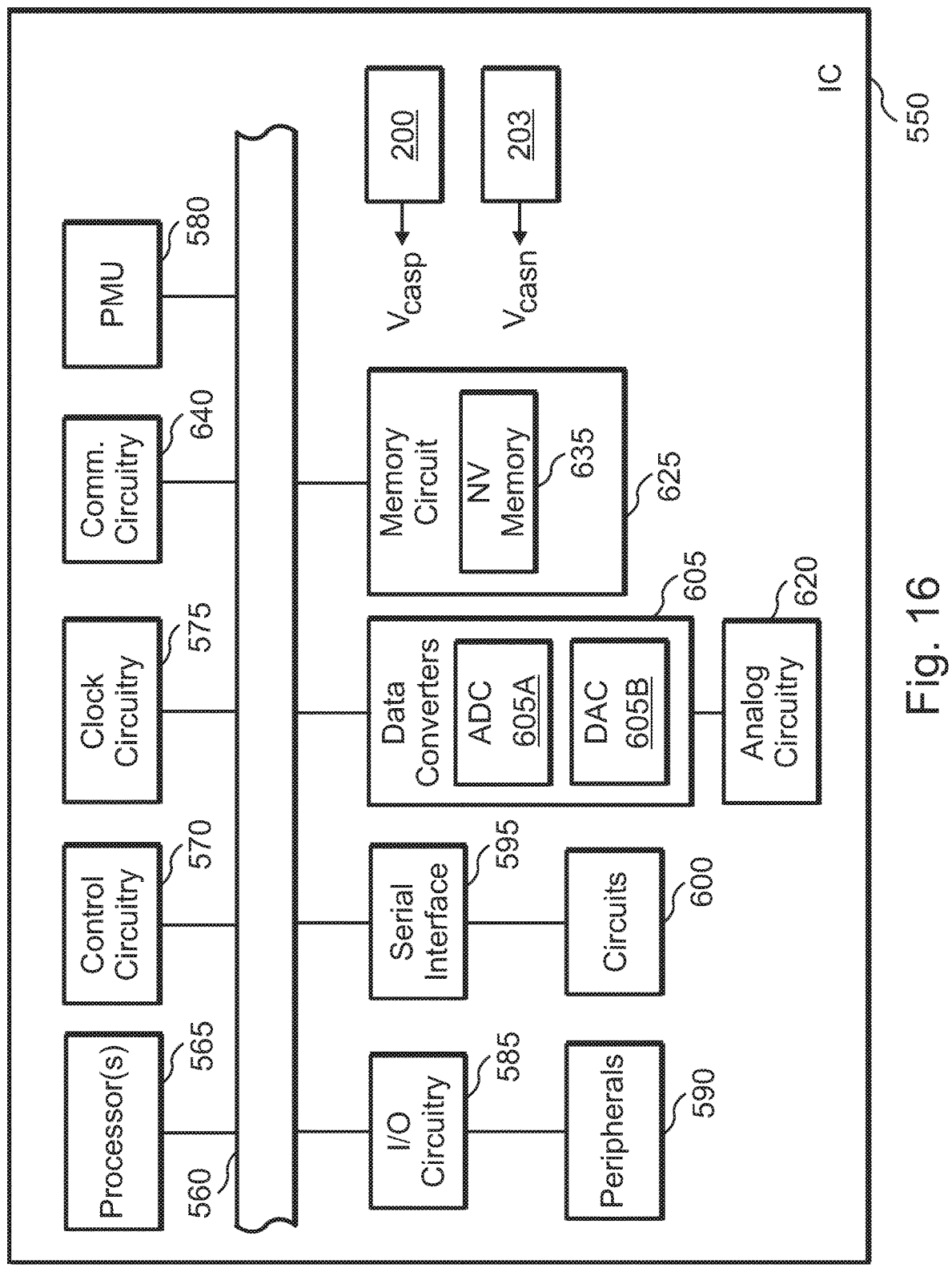
FIG. 16 depicts a block diagram of an IC, including a microcontroller unit (MCU), according to an exemplary embodiment.

As noted, GIDL-current-reduction techniques according to the disclosure may be used in a variety of circuits, blocks, subsystems, and/or systems. For example, in some embodiments, GIDL-current-reduction circuits may be integrated in an IC, such as an MCU. FIG. 16 shows a block diagram of an IC 550, including an MCU, according to an exemplary embodiment.

IC 550 includes a number of blocks and circuits that may constitute digital, analog, and/or mixed-signal circuitry. The leakage-reduction techniques described above may be included to one or more such blocks or circuitry, as desired.

IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 605B and/or one or more DACs 605A. The ADC(s) 615 receive analog signal(s) from analog circuitry 620, and convert the analog signal(s) to a digital format, which they communicate to one or more blocks coupled to link 560.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks, and information processing blocks, as desired.

Leakage-current reduction techniques according to exemplary embodiments may be applied to analog circuitry 620, as desired. Furthermore, leakage-current reduction techniques according to exemplary embodiments may be applied to ADC 605A and/or DAC 605A, as desired. In some embodiments, leakage-current reduction techniques are applied to the analog circuitry, whereas in some embodiments leakage-current reduction techniques are applied to the digital circuitry, yet in some other embodiments, leakage-current reduction techniques are applied to the analog circuitry and the digital circuitry.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580 to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand.

Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown). NV memory 635 may be used for storing information related to performance or configuration of one or more blocks in IC 550.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
an integrated circuit (IC), comprising:
complementary metal oxide semiconductor (CMOS) circuitry comprising a p-channel transistor network comprising at least one p-channel transistor having a gate-induced drain leakage (GIDL) current; and
a first native metal oxide semiconductor (MOS) transistor coupled to supply a first bias voltage to the at least one p-channel transistor to reduce the GIDL current of the at least one p-channel transistor.

2. The apparatus according to claim 1, wherein the IC further comprises:
an n-channel transistor network comprising at least one n-channel transistor having a GIDL current; and
a second native MOS transistor coupled to supply a second bias voltage to the at least one n-channel transistor to reduce the GIDL current of the at least one n-channel transistor.

3. The apparatus according to claim 2, wherein the second bias voltage is applied to a gate of the at least one n-channel transistor to reduce a drain-gate voltage of the at least one n-channel transistor.

4. The apparatus according to claim 2, wherein a plurality of native MOS transistors are coupled in cascade to supply the second bias voltage to the at least one n-channel transistor.

5. The apparatus according to claim 2, wherein the first bias voltage is a threshold voltage of the first native MOS transistor, and wherein the second bias voltage is a supply voltage of the CMOS circuitry minus a threshold voltage of the second MOS native transistor.

6. The apparatus according to claim 1, wherein the first bias voltage is applied to a gate of the at least one p-channel transistor to reduce a gate-drain voltage of the at least one p-channel transistor.

7. The apparatus according to claim 1, wherein a plurality of native MOS transistors are coupled in cascade to supply the first bias voltage to the at least one p-channel transistor.

8. An apparatus, comprising:
an integrated circuit (IC), comprising:
complementary metal oxide semiconductor (CMOS) circuitry comprising an n-channel transistor network comprising at least one n-channel transistor having a gate-induced drain leakage (GIDL) current; and
a first native metal oxide semiconductor (MOS) transistor coupled to supply a first bias voltage to the at least one n-channel transistor to reduce the GIDL current of the at least one n-channel transistor.

9. The apparatus according to claim 8, wherein the IC further comprises:
a p-channel transistor network comprising at least one p-channel transistor having a GIDL current; and
a second native MOS transistor coupled to supply a second bias voltage to the at least one p-channel transistor to reduce the GIDL current of the at least one p-channel transistor.

10. The apparatus according to claim 9, wherein the second bias voltage is applied to a gate of the at least one p-channel transistor to reduce a gate-drain voltage of the at least one p-channel transistor.

11. The apparatus according to claim 8, wherein a plurality of native MOS transistors are coupled in cascade to supply the first bias voltage to the at least one n-channel transistor.

12. The apparatus according to claim 9, wherein a plurality of native MOS transistors are coupled in cascade to supply the second bias voltage to the at least one p-channel transistor.

13. The apparatus according to claim 9, wherein the first bias voltage is a supply voltage of the CMOS circuitry minus a threshold voltage of the first native MOS transistor, and wherein second bias voltage is a threshold voltage of the second native MOS transistor.

14. The apparatus according to claim 8, wherein the first bias voltage is applied to a gate of the at least one n-channel transistor to reduce a drain-gate voltage of the at least one n-channel transistor.

15. A method of reducing a gate-induced drain leakage (GIDL) current of at least one transistor in a complementary metal oxide semiconductor (CMOS) circuit, the method comprising using a native metal oxide semiconductor (MOS) transistor to supply a bias voltage to a gate of at least one transistor in the CMOS circuit so as to reduce a voltage between a drain and the gate of the at least one transistor.

16. The method according to claim 15, wherein the at least one transistor is included in a p-channel transistor network of the CMOS circuit.

17. The method according to claim 15, wherein the at least one transistor is included in an n-channel transistor network of the CMOS circuit.

18. The method according to claim 15, wherein the native MOS transistor is a p-channel transistor, and the at least one transistor in the CMOS circuit is an n-channel transistor.

19. The method according to claim 15, wherein the native MOS transistor is an n-channel transistor, and the at least one transistor in the CMOS circuit is a p-channel transistor.

20. The method according to claim 15, wherein the bias voltage depends on one or more of a supply voltage of the CMOS circuit and a threshold voltage of the native MOS transistor.

* * * * *